(12) United States Patent
Joshi et al.

(10) Patent No.: US 7,786,911 B2
(45) Date of Patent: Aug. 31, 2010

(54) RESETTABLE HIGH ORDER DELTA-SIGMA ANALOG TO DIGITAL CONVERTER

(75) Inventors: Atul Joshi, Thousand Oaks, CA (US); Hakan Durmus, Los Angeles, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 11/986,117

(22) Filed: Nov. 19, 2007

(65) Prior Publication Data
US 2009/0128385 A1    May 21, 2009

(51) Int. Cl.
*H03M 3/00* (2006.01)
(52) U.S. Cl. .................. 341/143; 341/118; 341/122; 341/155; 341/161; 341/162
(58) Field of Classification Search .............. 341/118, 341/120, 143, 155, 161
See application file for complete search history.

(56) References Cited

U.S. PATENT DOCUMENTS

| | | | | |
|---|---|---|---|---|
| 4,903,026 A * | 2/1990 | Tiemann et al. | ............ | 341/131 |
| 5,142,286 A * | 8/1992 | Ribner et al. | ............ | 341/143 |
| 5,369,403 A * | 11/1994 | Temes et al. | ............ | 341/143 |
| 5,668,549 A * | 9/1997 | Opris et al. | ............ | 341/118 |
| 5,896,101 A * | 4/1999 | Melanson | ............ | 341/143 |
| 6,188,345 B1 * | 2/2001 | McDonald et al. | ............ | 341/143 |
| 6,198,417 B1 * | 3/2001 | Paul | ............ | 341/143 |
| 6,271,782 B1 * | 8/2001 | Steensgaard-Madsen | .... | 341/143 |
| 6,348,888 B1 * | 2/2002 | Yu | ............ | 341/161 |
| 6,489,913 B1 * | 12/2002 | Hansen et al. | ............ | 341/156 |
| 6,515,606 B2 * | 2/2003 | Lyden | ............ | 341/143 |
| 6,750,795 B2 * | 6/2004 | Gupta | ............ | 341/143 |
| 6,750,796 B1 * | 6/2004 | Holloway et al. | ............ | 341/143 |
| 6,765,520 B1 * | 7/2004 | Chuang et al. | ............ | 341/143 |
| 6,909,391 B2 * | 6/2005 | Rossi | ............ | 341/161 |
| 6,914,549 B2 * | 7/2005 | Chen et al. | ............ | 341/155 |
| 6,954,549 B2 | 10/2005 | Kraft | ............ | 382/167 |
| 6,963,300 B1 * | 11/2005 | Lee | ............ | 341/172 |
| 6,970,120 B1 * | 11/2005 | Bjornsen | ............ | 341/120 |
| 7,123,177 B2 * | 10/2006 | Cheng et al. | ............ | 341/143 |
| 7,432,841 B1 * | 10/2008 | Kinyua | ............ | 341/143 |

(Continued)

OTHER PUBLICATIONS

Joshi et al., "Scalable Architecture for High-Resolution Video-Rate CMOS Imaging System on Chip", 2005 IEEE Workshop on CCDs and Advanced Image Sensors, pp. 181-185.

(Continued)

*Primary Examiner*—Linh V Nguyen
(74) *Attorney, Agent, or Firm*—Koppel, Patrick, Heybl & Dawson

(57) ABSTRACT

A high-order delta-sigma analog-to-digital converter. A plurality of stages are connected to accept an analog input signal and produce a digital output signal. Each stage has a resettable Δ-Σ converter of second order or higher. Resetting each stage before accepting a new input purges the integrators of any information related to the previous input, allowing step inputs to the system. The stability of the converter is ensured using local feedback loops at each stage. Each stage provides a digital representation of a portion of the analog input signal. A decimation filter receives the digital signals from the stages and arranges them into the digital output signal.

32 Claims, 5 Drawing Sheets

U.S. PATENT DOCUMENTS

| | | | |
|---|---|---|---|
| 7,439,889 B2* | 10/2008 | Fujimoto | 341/143 |
| 2002/0140589 A1* | 10/2002 | Bazarjani | 341/143 |
| 2008/0143568 A1* | 6/2008 | Zhixu et al. | 341/143 |

OTHER PUBLICATIONS

C. Jansson, "A High-Resolution, Compact, and Low Power ADC Suitable for Array Implementation in Standard CMOS", IEEE Transactions on Circuits and Systems-I: Fund. Theory and App., vol. 42, pp. 904-912, Nov. 1995.

S.A. Paul et al., "A Nyquist-Rate Pipelined Oversampling A/D Converter", IEEE Journal of Solid-State Circuits, vol. 34, No. 12, pp. 1777-1787, Dec. 1999.

R. Harjani et al., "FRC: A Method for Extending the Resolution of Nyquist Rate Converters Using Oversampling", IEEE Transactions on Circuits and Systems-II, vol. 45, No. 4, pp. 482-494, Apr. 1998.

* cited by examiner

US 7,786,911 B2

RESETTABLE HIGH ORDER DELTA-SIGMA ANALOG TO DIGITAL CONVERTER

BACKGROUND OF THE INVENTION

1. Field of the Invention

This invention relates to high resolution analog-to-digital converters (ADCs), and more particularly to resettable high order delta-sigma ADCs.

2. Description of the Related Art

Analog-to-digital converters (ADCs) and their counterpart digital-to-analog converters (DACs) are an important class of electrical systems. They are ubiquitous in electrical circuits, having applications ranging from automotive systems to advanced communication systems. Just as the name conveys, ADCs accept a continuous analog signal and convert it to a discrete digital signal. DACs perform the reverse operation. A good ADC recreates an analog signal digitally while maintaining the integrity of the original signal and limiting information loss to an acceptable level.

Several different design approaches have been utilized to realize ADC circuitry, such as flash converters, single- and dual-slope integrating converters, and tracking converters. Each of these designs offers various advantages over the others. Some important characteristics of ADCs include resolution, conversion rate or speed, and step recovery. Resolution is the number of binary bits output by the converter. Speed is a measure of how fast the converter can output a new binary number. In discrete time systems and digital signal processing, bandwidth is associated with the sampling rate, and the term is often used to describe the speed of such a system. Step recovery is a measure of how fast a converter can react in response to a large, sudden jump in the input signal.

A great deal of research and design work has been done to achieve a high-bandwidth, high-resolution ADC. This is a challenge as these two characteristics are inversely related. A high-resolution output requires large amounts of data to be processed, increasing system process time and thus decreasing bandwidth. Advances in the area of high-bandwidth, high-resolution ADCs have been made in some systems such as GaAs and InP; however, these systems require a great deal more power than do systems using silicon, for example.

One area of technology driving the development of faster ADCs is high-speed high-resolution imaging. CMOS image sensor processes have led to very small devices having all of the imager components on a single chip. See Joshi et al., "*Scalable Architecture for High-Resolution Video-Rate CMOS Imaging System On Chip,*" 2005 IEEE Workshop on CCDs and Advanced Image Sensors, pp. 181-185, 2005. The detector, the pixel multiplexer, the column processors can all be implemented on the same silicon using these advanced processes. As a result, there are several high quality cost-efficient camera systems on the market today.

Current state-of-the-art imagers digitize image data to 10-12 bits of resolution at 10 s of mega samples per second (MSPS). Recent scientific, industrial and aerospace applications demand higher resolution at even higher output rates. New ADC technologies are needed to satisfy these high-speed requirements. Pipeline converters have been the choice of digitization in imaging applications, because they are realized in a standard CMOS process. They have moderate resolution and can be operated at video rates. The current trend in imaging is moving toward higher resolution at higher frame rates. A parallel array of pipeline converters can provide the desired rates at the expense of increased complexity and power. These applications require low-power high-resolution ADCs that work well in the digital environment.

One solution is to use high-order parallel delta-sigma ($\Delta$-$\Sigma$) converters. The circuitry for these converters is relatively simple, but they require oversampling the input to reduce errors and noise. $\Delta$-$\Sigma$ converters usually assume a band-limited input. The converter decimation filters use the band-limited input assumption and previous output values to predict a current value. However, for imaging applications, correlation between samples is not acceptable. Array-based sensor applications often have uncorrelated pixel data either due to the type of the application (high MTF requirement) or due to the readout scheme (e.g., a single channel reading nonadjacent channels successively).

Each sample coming out of a sensor readout circuit is a step input to a $\Delta$-$\Sigma$ converter. Using the classical $\Delta$-$\Sigma$ approach would result in the loss of current data due to some residual memory of the previous sample. This problem may be addressed by resetting the ADC for each input in a first-order system. FIG. 1 illustrates a known first-order resettable $\Delta$-$\Sigma$ converter. A resettable first-order $\Delta$-$\Sigma$ ADC is presented in C. Jansson, "*A High-Resolution, Compact, and Low-Power ADC Suitable for Array Implementation in Standard CMOS*", IEEE Transactions on Circuits and Systems-I: Fund. Thoery and App., vol. 42, pp. 904-912, November 1995. However, first-order systems require high oversampling ratios to achieve high accuracy. Their applications are limited to in-pixel conversions or low-accuracy, low-power parallel readout schemes. Recently, the order of a resettable system has been increased to a second-order system. See S. A. Paul et al., "*A Nyquist-Rate Pipelined Oversampling A/D Converter*", IEEE Journal of Solid-State Circuits, Vol. 34, No. 12, pp. 1777-1787, December 1999; R. Harjani et al., "*FRC: A Method for Extending the Resolution of Nyquist Rate Converters Using Oversampling*", IEEE Transactions on Circuits and Systems-II, Vol. 45, No. 4, pp. 482-494, April 1998.

SUMMARY OF THE INVENTION

One embodiment of an analog-to-digital converter (ADC) that produces a digital output signal in response to an analog input signal comprises the following elements. A plurality of cascaded stages is connected to receive a respective stage input signal and produce a respective stage digital signal. Each of the stages comprises: a resettable integrator connected in a local feedback loop; a comparator arranged within the feedback loop and connected to receive output from the resettable integrator, compare it with at least one reference signal and generate the stage digital signal; and an adjustor connected to receive the stage digital signal and adjust the stage input signal if a condition is satisfied, the adjustor providing an adjusted signal that is fed back to the resettable amplifier.

One embodiment of a delta-sigma analog-to-digital converter (ADC) that produces a digital output signal in response to an analog input signal comprises a plurality of delta-sigma converter stages. Each of the stages receives a respective stage input signal, comprises a resettable integrator connected in a local feedback loop, and produces a stage digital signal that represents a portion of the analog input signal. A decimation filter is connected to receive and arrange the stage digital signals into the digital output signal.

One embodiment of an imager device comprises the following elements. An input element is arranged to accept radiation and generate an analog input signal. A plurality of delta-sigma analog-to-digital converters (ADCs) of at least second-order is connected to receive and convert the input signal into a digital output signal.

One method of analog-to-digital conversion, comprises the following actions. An analog input signal is provided to a converting stage in a series of converting stages. The analog input signal is integrated at an integrator within the stage to produce an integrated signal. The integrated signal is oversampled such that a plurality of samples is taken, wherein the integrator is reset before each sample is taken. The integrated signal is digitized. The digitized signal is subtracted from the analog input signal at a summer element to produce a differential signal. The differential signal is fed back to the integrator.

DETAILED DESCRIPTION OF THE INVENTION

Figure 1:
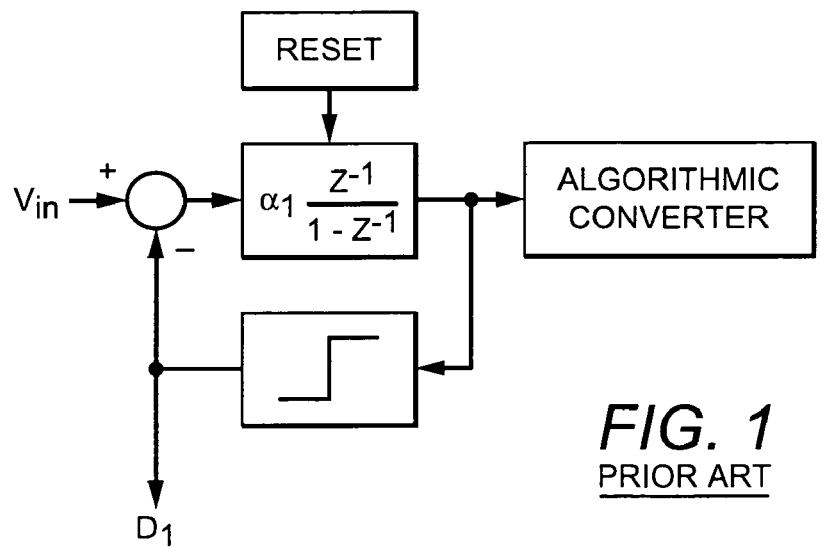
FIG. 1 is a schematic of a known first-order Δ-Σ converter.

Embodiments of the present invention present resettable high-order (i.e., at least second-order) ADCs capable of providing high-resolution digital representations of an analog input signal without the need for trimming or calibration. By oversampling the input signal, the matching accuracy requirements of the ADC components are relaxed. The oversampling ratio is defined as the number of times the input is sampled to produce a single output. The stability of the system is achieved with local feedback loops that operate in each stage of the system. Resetting the ADC and its decimation filter for each input removes the history of previous samples and prevents correlation between successive input signals.

High-order resettable Δ-Σ converters, like conventional Δ-Σ converters, comprise sampled/continuous time domain integrators that perform the summation of previous data with current input and comparators (coarse ADCs) that provide a conditional reference signal. The reference signal is then conditionally subtracted from the value of the input to the stage. A digital representation of the input is achieved by filtering these estimations during the oversampling period.

Embodiments of a resettable Δ-Σ converter comprise a series of cascaded stages, each of which is locally stabilized with feedback. Resetting the integrators at each stage for each input removes the history of prior data. Although component matching is important, the requirements are relaxed relative to traditional cascaded architectures, because the subtraction operation depends on matching of only one capacitor ratio which simplifies the design.

The high-order Δ-Σ conversion algorithm comprises two general steps. First, the system stages are reset so that the history of previous input is deleted. Meanwhile, the input is integrated, providing an initial estimation of the input level to the stage comparators. Second, the stages run for a number (M) of cycles of Δ-Σ operation, generating M samples. The signal-to-noise ratio (SNR) of an $L^{th}$ order resettable Δ-Σ converter with an oversampling ratio M is given by the Equation 1, where α is the capacitor ratio (integrator gain) of the integrating amplifier in each stage:

$$SNR \propto \left[\frac{(\alpha M)^L}{L!}\right]^2 \quad \text{(Eq. 1)}$$

Here, α is assumed to be the same for each stage. The equation predicts a behavior that comports with traditional Δ-Σ converter performance. In order to increase the SNR, either the oversampling ratio M can be increased, or the order of the system L can be increased. The present invention provides higher-order (L≧2) Δ-Σ converters so that smaller oversampling ratios M can be used.

Although the terms first, second, etc. may be used herein to describe various elements or components, these elements or components should not be limited by these terms. These terms are only used to distinguish one element or component from another unless explicitly stated otherwise. Thus, a first element or component discussed below could be termed a second element or component without departing from the teachings of the present invention. It is noted that the terms "first-order", "second-order", "third-order", etc., are understood in the art to specify the number of stages in the device. For example, a third-order device would have three integrators cascaded one after another.

Embodiments of the invention are described herein with reference to schematic illustrations of idealized embodiments of the invention. As such, variations from the physical layout shown are expected. Embodiments of the invention should not be construed as limited to the physical arrangements illustrated herein but are to include deviations. Thus, the elements and components illustrated in the figures are schematic in nature and their shapes are not intended to illustrate the precise shape of a device and are not intended to limit the scope of the invention.

Figure 2:
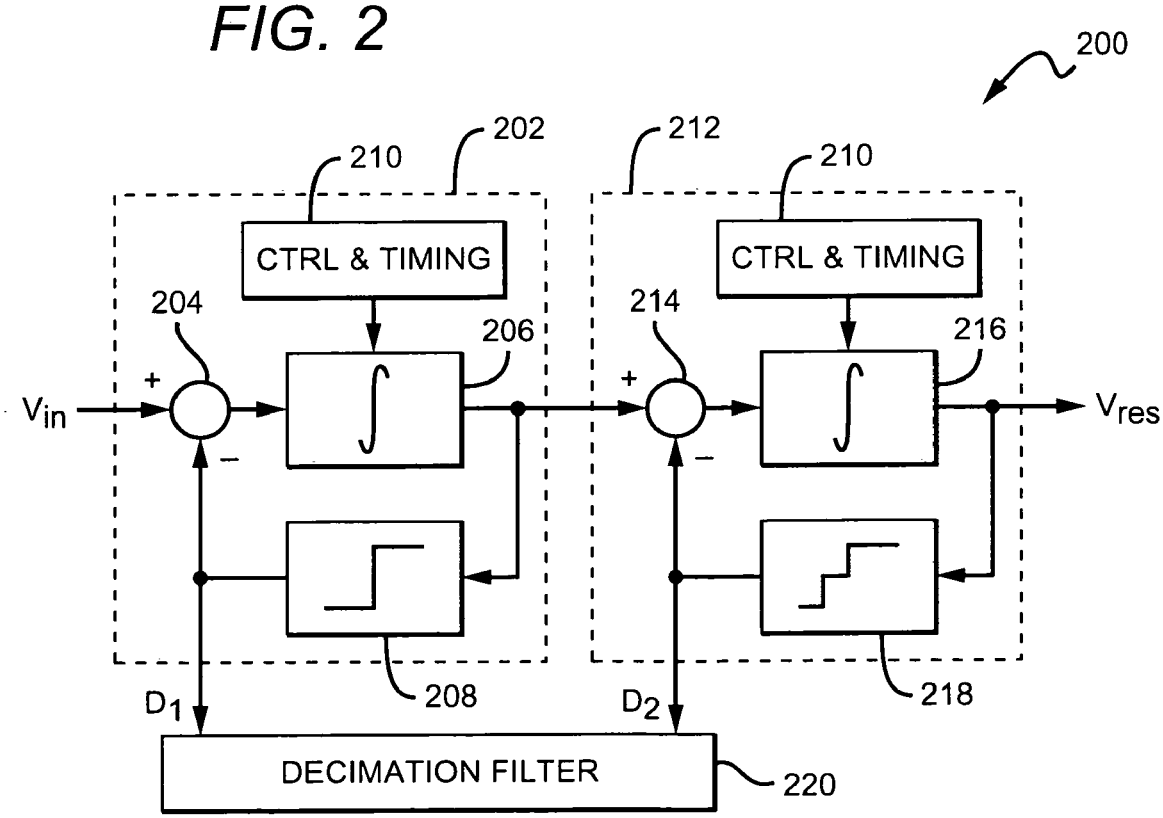
FIG. 2 is a schematic of a second-order Δ-Σ converter device according to an embodiment of the present invention.

FIG. 2 is a schematic illustration of a second order Δ-Σ converter device 200 according to an embodiment of the present invention. The device 200 comprises first and second resettable Δ-Σ converter stages 202, 212 and a control and timing circuit 210 which is replicated for each stage.

A first converter stage 202 receives an analog input signal $V_{in}$. This stage 202 operates as a first-order resettable Δ-Σ converter. The stage 202 comprises a summer 204, an integrator such as an integrating amplifier 206, and a comparator 208. Before each input, the control and timing circuit 210 resets the integrator, purging it of any information related to a previous input. $V_{in}$ is then integrated at the integrating amplifier 206 to get a good initial estimate of the input signal. The integrated signal is sampled, and the sampled value is compared to at least one reference voltage in the comparator 208. The comparator 208 is used to set a condition for the sampled signal. If the condition is satisfied, the comparator 208 outputs a reference signal which is based on the condition, the stage digital signal $D_1$. If the condition fails an alternate reference signal or no reference signal is output. The condition can have more than two output states. This would be the case if a multi-level comparator is used. For example, if the comparator is a 1.5 bit ADC, there are three voltage ranges that the sampled signal might fall into: a high range, a middle range and a low range. Thus, the comparator would output one of three reference voltages associated with each of these ranges as the stage digital signal (e.g., +1V, 0, or −1V). This reference signal is then used to adjust the stage input signal.

The stage digital signal $D_1$ for the first cycle is input to a decimation filter 220 during each of M cycles. Implementations of a compatible decimation filter are discussed in detail below. At the same time, $D_1$ is also fed back to the summer 204 where it is subtracted (or, in effect, added if $D_1$ is negative) from $V_{in}$. Adjustments other than simple subtraction may also be made to the input signal at this stage if necessary in which case the summer element 204 would be replaced with an adjustor. The difference between these signals, the residue, is passed along to the next stage 212 for finer resolution.

A second resettable Δ-Σ converter stage 212 is cascaded with the first stage 202. Similar to the first stage, the stage 212 comprises a summer 214, an integrating amplifier 216, and a comparator 218. The stage 212 operates similarly as the first stage 202. The residue $V_{res}$ of the stage 212 can be output to a backend ADC (not shown). Cascading the resettable Δ-Σ stages 202, 212 allows more information about the input to be gathered in a shorter period of time. Each of the stages is resettable and has its own individual coarse decisions. The local decisions at each stage ensure stability without unduly restricting the input level, even at orders higher than two.

Each of the stages 202, 212 has a sampled integrating amplifier 206, 216, respectively. The integrator element may also be implemented as a continuous-time integrating amplifier. The integrating amplifiers 206, 216 are connected in feedback such that the outputs try to follow the inputs with coarse decisions. Eventually, the average of coarse decisions provides a digital representation of the input. Higher oversampling ratios result in increased resolution. The need for a high oversampling ratio is mitigated by the increased order of the cascaded system. Because the integrating amplifiers are resettable, a bandlimited input is not necessary for a sampled input that is held for the duration of conversion. The performance of the converter device 200 is characterized by Equation 2:

$$V_{in} = \frac{\frac{V_{res}}{\alpha_1 \alpha_2} + \sum_{j=1}^{M} \sum_{k=1}^{j} D_{1k} V_{ref} + \frac{1}{\alpha_1} \sum_{k=1}^{M+1} D_{2k} V_{ref}}{\left(\frac{M^2 + 3M + 2}{2}\right)} \quad (Eq. 2)$$

In Eq. 2, $D_{1k}$ and $D_{2k}$ represent the stage digital signals of the $k^{th}$ cycle from the stages 202, 212, respectively. The capacitor ratio of each stage (i.e., the integrating amplifier gain) is represented by α. To extend the resolution of the device 200 with a backend converter (not shown), the error in $V_{res}$ has to be smaller than the resolution of the succeeding stage. Thus, matching requirements and thermal noise limits inform the choice of capacitor values and the gain of the integrating amplifier 206 (expressed as ratio α).

The comparators 208, 218 may be multi-level comparators, for example, a 1.5 bit ADC, enabling a conditional subtraction. If the stage output is below a low reference voltage or above a high reference voltage, the feedback path is activated and output signal is adjusted to remain within a desired level. For small output values, the feedback path is not needed, because the output will not saturate even if large output from a previous stage exists at the stage input. This provides additional accuracy for the output of each cycle. However, the output of a multi-level comparator can exhibit nonlinearities due to component mismatch. Because these nonlinearities are passed on to subsequent stages, it is important to get a substantially linear output from at least the first stage. One way to limit nonlinearities in the first stage 202 is to use a 1-bit comparator. If a multi-level comparator is used in the initial stage, components must be closely matched which can be costly and inefficient. Because the previous stage 202 suppresses the mismatch errors from the succeeding stage 212, the use of multi-level comparators in the later stage 212 can yield additional resolution in the coarse ADC with acceptable error levels. 1-bit comparators may be used in the later stages as well, but with less resolution at each stage.

The control and timing circuit 210 employs a half-period timing scheme. Following a pipelined operation sequence, in the first half of the period the integrating amplifier 206 updates its outputs, which is sampled on the input capacitor of the integrating amplifier 206. In the second half period, the output of stage 212 is updated while the stage 202 samples the input signal.

Figure 3:
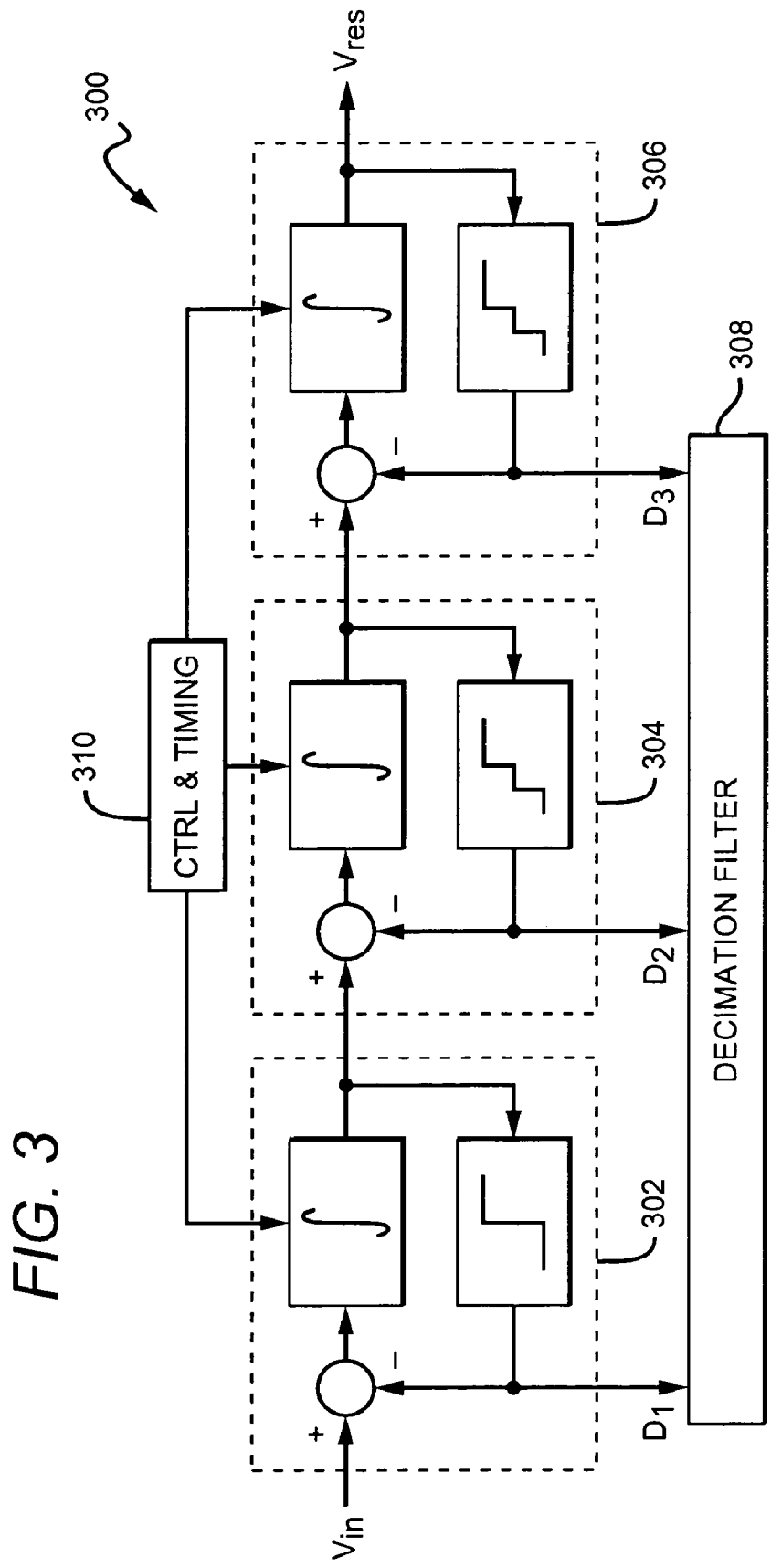
FIG. 3 is a schematic of a third-order Δ-Σ converter device according to an embodiment of the present invention.

The order of the system may be increased by adding additional Δ-Σ converter stages that further suppress the quantization noise. The third-order arrangement is achieved by cascading a second-order converter similar to the device 200 with a first-order stage. FIG. 3 is a schematic illustration of a third-order resettable Δ-Σ device 300 according to an embodiment of the present invention. The device 300 comprises three cascaded stages: a coarse stage 302, an intermediate stage 304, and a final stage 306. Similar to the stages of second order device 200, each stage comprises a summer, an integrating amplifier, and a comparator. The analog signal $V_{in}$ is input to the device 300. The final stage 306 outputs the residue signal $V_{res}$ which can be converted with a backend converter (not shown) or it can be transmitted to additional ADC stages (not shown) for finer resolution. There are also stage digital outputs $D_1$, $D_2$, $D_3$ corresponding to the comparator outputs at each stage. $D_1$, $D_2$ and $D_3$ are all output to a decimation filter 308. A control and timing circuit 310 is connected to each of the stages to synchronize the stages and perform other functions, such as the reset function.

The resolution from the third-order device 300 is high enough that backend ADCs (not shown) may not be necessary. In comparison to classical Δ-Σ operation, the only overhead is the reset cycle. If the oversampling ratio is small, capacitor mismatch errors will dictate the linearity of the ADC.

In one embodiment, the comparator in the coarse stage 302 is a 1-bit comparator. As discussed above it is desirable to get a linear response from the first stage so that nonlinearity errors are not passed on to subsequent stages. The intermediate stage 304 and the final stage 306 may have multi-level comparators as shown, or they may also function with a 1-bit comparator. Using multi-level comparators in the stages 304, 306 adds resolution without significantly increasing nonlinearity errors. 1-bit or multi-level comparators may be used in any of the stages.

Equation 3 characterizes the response of the device 300:

$$V_{in} = \frac{\frac{V_{res}}{\alpha_1 \alpha_2 \alpha_3} + \sum_{i=1}^{M} \sum_{j=1}^{i} \sum_{k=1}^{j} D_{1k} + \frac{1}{\alpha_1} \sum_{j=1}^{M+1} \sum_{k=1}^{j} D_{2k} + \frac{V_{res}}{\alpha_1 \alpha_2} \sum_{k=1}^{M} D_{3k}}{\left(\frac{M^3}{6} + M^2 + \frac{11M}{6} + 1\right)} \quad (Eq. 3)$$

Figure 4:
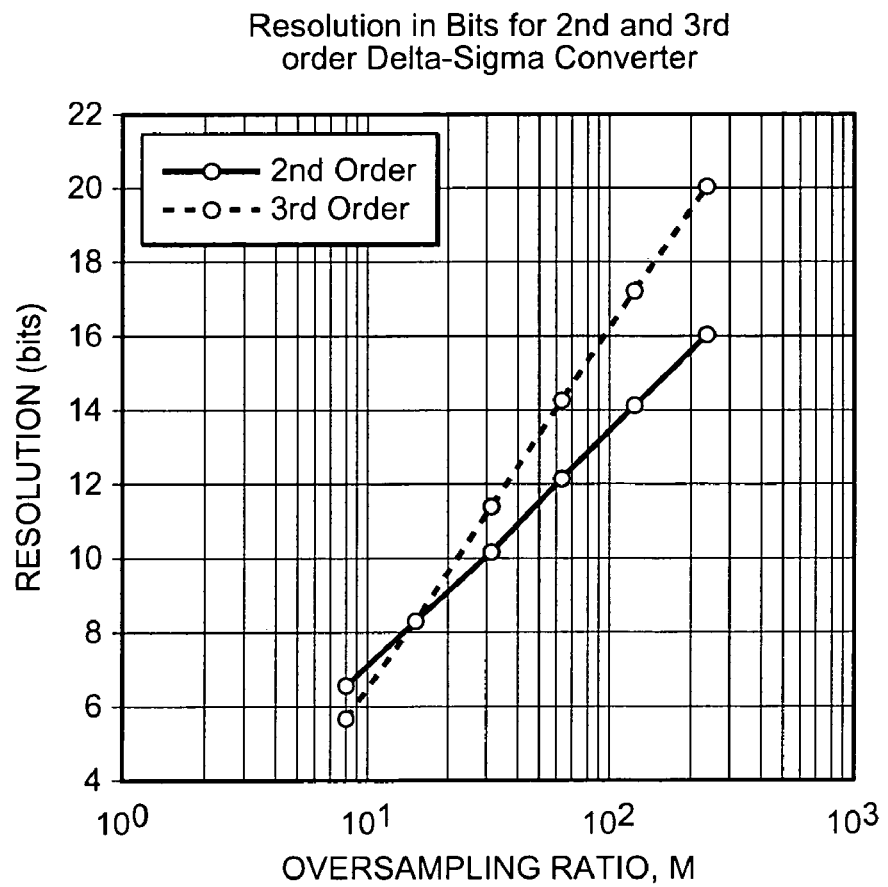
FIG. 4 is a graph comparing resolution versus oversampling ratio for second- and third-order Δ-Σ converters.

The denominator is a third-order polynomial of M, as expected. FIG. 4 is a graph showing the resolution versus OSR for second- and third-order Δ-Σ converters. For resolutions greater than 8 bits, the third-order system gets more resolution for a given OSR. The third-order system achieves 18 dB per octave of OSR as compared to 12 dB per octave in the second-order system.

Figure 5:
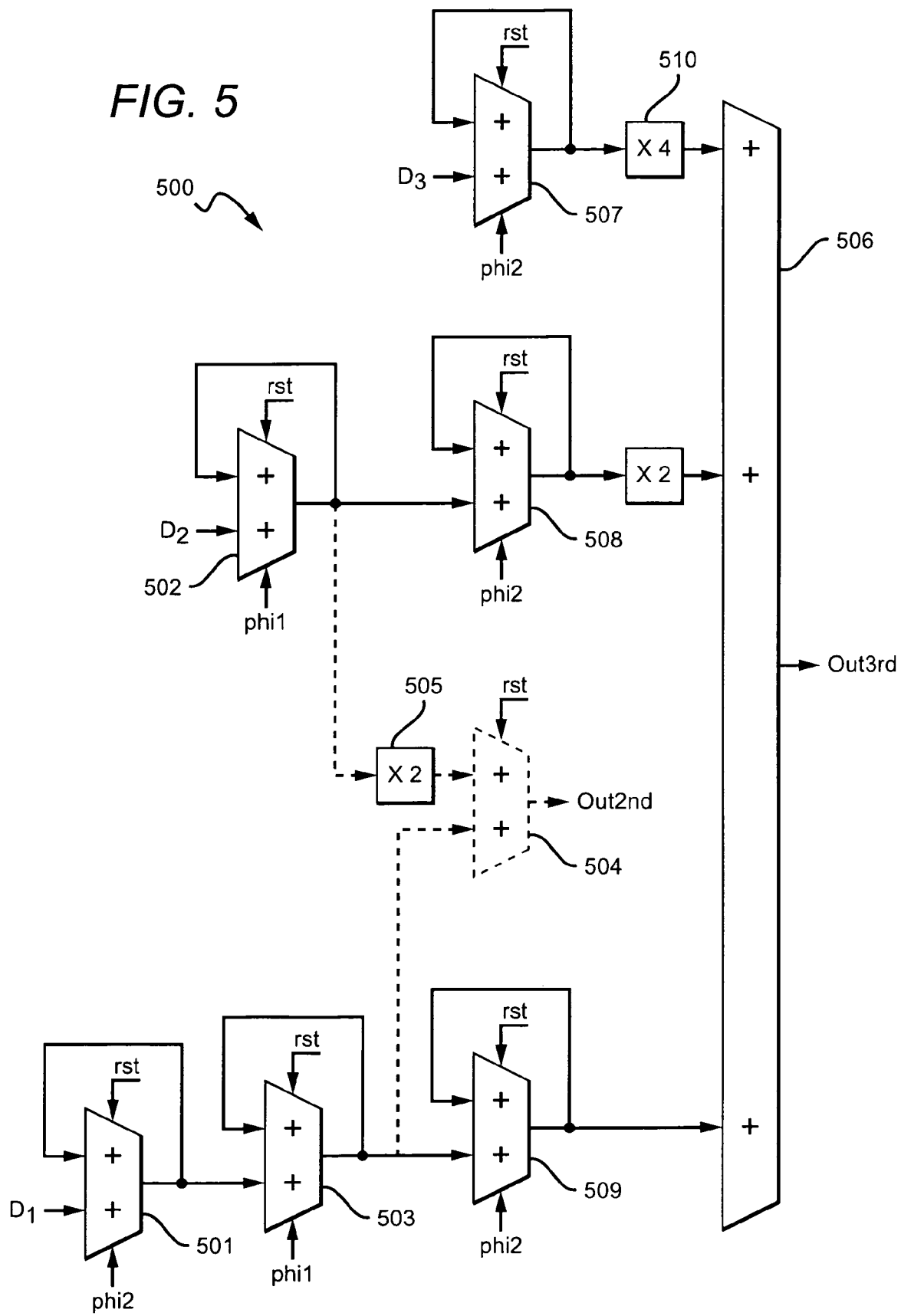
FIG. 5 is schematic of a selectable order decimation filter according to an embodiment of the present invention.

FIG. 5 is a schematic illustration of a decimation filter 500 for second- and third-order systems according to embodiments of the present invention. The capacitor coefficients in either system can be chosen in a binary ratio such that the decimation filter 500 can be implemented using only accumulators and shifters (e.g., $\alpha=2^n$, where n is an integer). The comparators from the various stages are latched at different phases since they arranged in a pipelined scheme. The label "phi1" indicates operation in a first phase; "phi2" indicates second phase operation.

If the output is taken from the dashed block representing a two-input adder 504, a second-order decimation filter is realized. The second-order decimation filter comprises three accumulators 501, 502, 503, a two-input adder 504 and a 1-bit shifter 505. The stage digital signals $D_1$ and $D_2$ from the stages of the second-order device are input to accumulators 501 and 502, respectively. The decimation filter 500 uses a simple weighted average formula to calculate the output value from each stage. These outputs are easily combined with shifting operations, resulting in a digital representation of the original input signal for that cycle.

If the output is taken from the three-input adder 506, the decimation filter 500 functions as a third-order decimation filter. In this way, the decimation filter 500 is capable of functioning as a variable order system in which the order is selectable. The third-order decimation filter comprises the second-order decimation filter plus three additional accumulators 507-509, a 2-bit shifter 510, and the three-input adder 506. The stage digital signal $D_3$ from the third stage is input to the accumulator 507 as shown.

Because the accumulators are reset for each input, it is not necessary to keep higher number of bits than the resolution of the ADC in the accumulation registers. These implementations of simple decimation filters fit into the columns of a sensor array and dissipate very little power.

One advantage of the higher-order Δ-Σ converter devices 200, 300 is compatibility with the decimation filter 500. All of the components of the decimation filter 500 require very little area and are simple to implement, resulting in a cost-effective finished product.

It is understood that higher order Δ-Σ converters are realizable using a similar architecture by adding additional cascaded stages onto the end of a Δ-Σ converter. For example, a fourth-order Δ-Σ converter can be implemented with two cascaded second-order Δ-Σ converter. Local feedback loops at each stage ensure that the system remains stable. Higher order systems achieve better resolution for a given OSR. Decimation filters for these systems are easy and cheap to implement by simply extending the logic used to create the decimation filter 500 for orders higher than three.

Figure 6:
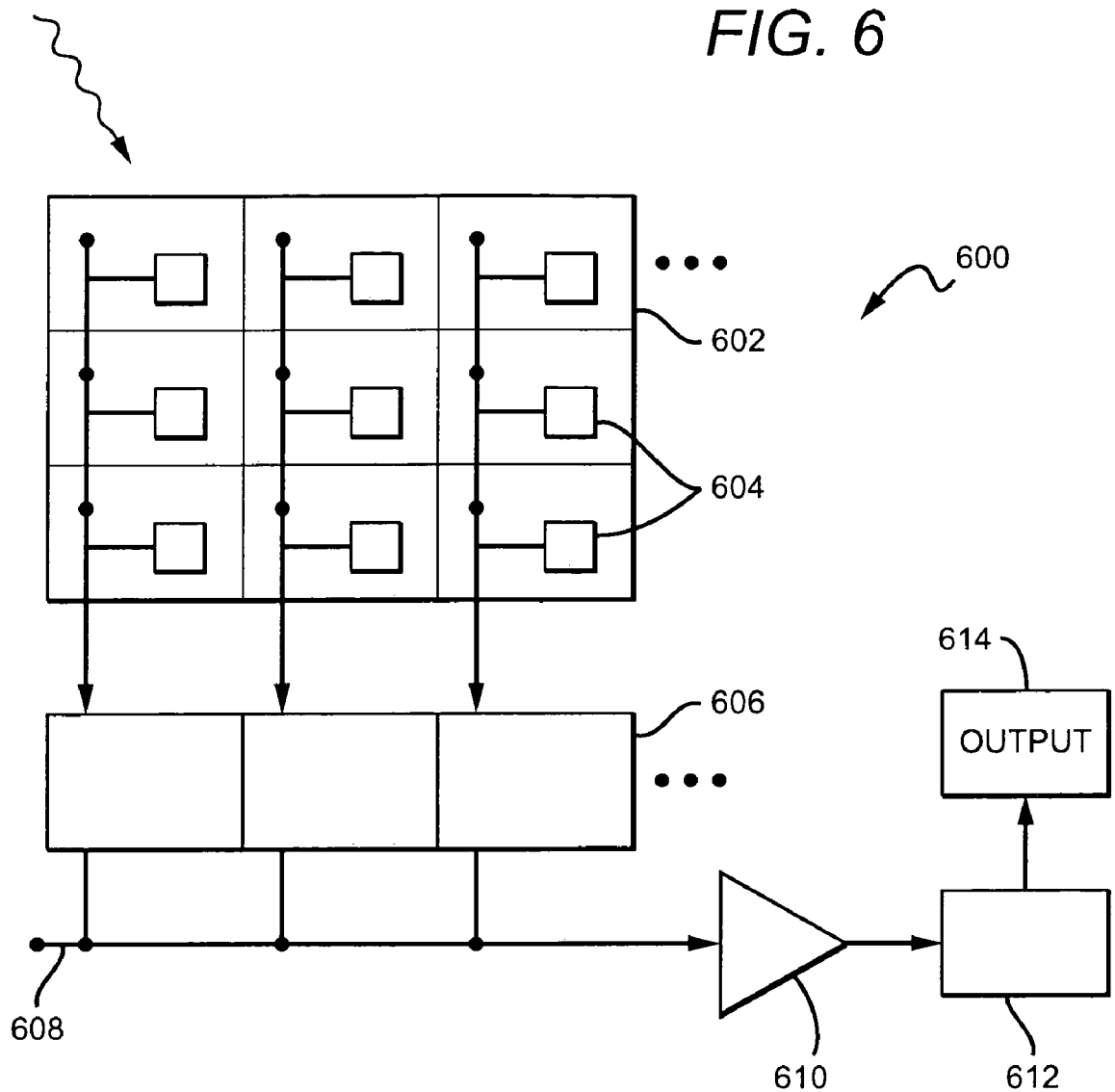
FIG. 6 is a block diagram of an imager device according to an embodiment of the present invention.

The high-order Δ-Σ converters are particularly well-suited for use in imaging devices. FIG. 6 illustrates on an imager device 600 according to an embodiment of the present invention. The imager device 600 comprises an input device designed to convert incident radiation into an analog input signal. Here, radiation is incident on the pixel array 602. An analog signal is generated at each pixel that corresponds to the intensity of the radiation at that point. The analog signal is subsequently converted to a digital representation which can then be easily processed and displayed or stored. A plurality of high-order Δ-Σ ADCs (second-order or greater) is used to accomplish the digital conversion. In one embodiment, each pixel in the array includes a high-order Δ-Σ ADC 604. Although the pixel array 602 is shown as a 3×3 array, it is understood that the Δ-Σ converters can be used in-pixel in arrays of any size. The input signals are converted in-pixel and then the digital signals are sent to columns and then to the output multiplexer. In another embodiment, the residue from the pixels (integrator's output at the end of the conversion) is further processed in the column circuitry. The column buffer 606 receives the residue signals from the columns of pixels and drives them onto a bus line 608. A video rate amplifier 610 may be used to transmit the signals to the residue ADC 612 (possibly pipelined). Meanwhile the digital signals from the pixels are sent to columns and then multiplexed to the output as the most significant bits of the data. The data is processed and then sent to an output device 614. The output device 614 may comprise a screen for visually displaying information related to the data, or the output device 614 may comprise a storage device for storing the data. Other output devices are also possible.

Figure 7:
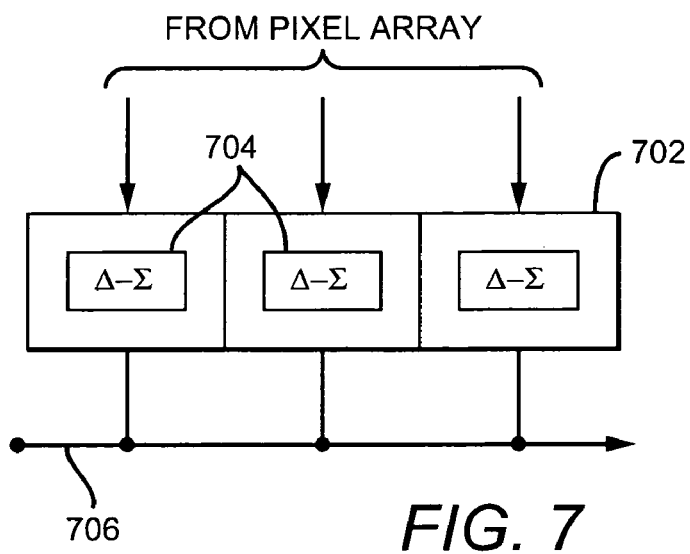
FIG. 7 is a block diagram of a portion of an imager device according to an embodiment of the present invention.

In another embodiment, the plurality of high-order Δ-Σ ADCs 704 is disposed in the place of the column buffer as shown in FIG. 7. FIG. 7 illustrates a portion of an imager device according to an embodiment of the present invention. Here, the analog-to-digital conversion is done in the column 702. In one embodiment, each column in the pixel array has a Δ-Σ converter 704 associated with it. However, other architectures having more or fewer Δ-Σ converters than columns are also possible. The signals from the pixels are converted to digital signals and driven onto the bus line 706 for transmission to processing and output system.

Although the present invention has been described in detail with reference to certain preferred configurations thereof, other versions are possible. Therefore, the spirit and scope of the invention should not be limited to the versions described above.

We claim:

1. An analog-to-digital converter (ADC) that produces a digital output signal in response to an analog input signal, comprising:
  a plurality of cascaded stages, each of said stages connected to receive a respective stage input signal and produce a respective stage digital signal, each of said stages comprising:
    a resettable integrator connected in a local feedback loop, said resettable integrator configured to reset before integrating each signal input;
    a comparator arranged within said feedback loop and connected to compare output from said resettable integrator with at least one reference signal and generate said stage digital signal; and
    an adjustor connected to receive said stage digital signal and to adjust said stage input signal if a condition is satisfied, said adjustor providing an adjusted signal that is fed back to said resettable integrator.

2. The ADC of claim 1, wherein said plurality of stages comprises delta-sigma converters.

3. The ADC of claim 2, wherein said plurality of stages comprises at least 3 stages.

4. The ADC of claim 1, further comprising a decimation filter connected to receive said stage digital signal from each of said stages.

5. The ADC of claim 4, wherein said decimation filter functions using only adding and shifting operations.

6. The ADC of claim 4, wherein the order of said decimation filter is selectable.

7. The ADC of claim 1, wherein said plurality of stages further comprises a coarse stage, and wherein said stage input signal for said coarse stage comprises said analog input signal.

8. The ADC of claim 7, wherein said comparator in said coarse stage is a 1-bit comparator.

9. The ADC of claim 1, wherein said comparator of at least one of said stages comprises a multiple-bit comparator.

10. The ADC of claim 1, wherein said condition is satisfied when said integrator output is greater than or equal to a threshold voltage.

11. The ADC of claim 1, further comprising a control and timing circuit connected to regulate the operation of each of said stages.

12. The ADC of claim 11, wherein said control and timing circuit resets said resettable integrators.

13. The ADC of claim 1, further comprising a backend converter connected to receive said resettable integrator output from the last of said stages arranged in series.

14. The ADC of claim 1, wherein the output of the resettable integrator is sampled with an oversampling ratio equal to $2^n$, where n is an integer.

15. The ADC of claim 1, wherein said adjustor comprises a summer and said adjusted signal comprises a differential signal that results when said stage digital signal is subtracted from said stage input signal.

16. A delta-sigma analog-to-digital converter (ADC) that produces a digital output signal in response to an analog input signal, comprising:
a plurality of delta-sigma converter stages, each of said stages having an input to receive a respective stage input signal and comprising a resettable integrator connected in a local feedback loop, each of said stages configured to produce a respective stage digital signal that represents a portion of said analog input signal;
each of said stages further comprising a comparator connected to receive an integrated signal from said integrator and produce said stage digital signal;
each of said stages further comprising a summer connected to receive said stage digital signal and conditionally subtract said stage digital signal from said stage input signal; and
a decimation filter connected to receive and arrange said stage digital signals into said digital output signal;
wherein each of said integrators is reset before integrating each of said respective stage input signals.

17. The delta-sigma ADC of claim 16, wherein said plurality of delta-sigma converter stages comprises three delta-sigma converter stages.

18. The delta-sigma ADC of claim 16, wherein said plurality of delta-sigma converter stages comprises four delta sigma converter stages.

19. The delta-sigma ADC of claim 16, wherein said decimation filter functions using only adding and shifting operations.

20. The delta-sigma ADC of claim 16, wherein the order of said decimation filter is selectable such that said decimation filter is compatible with a variable number of said delta-sigma converter stages.

21. The delta-sigma ADC of claim 16, wherein the output of the resettable integrator is sampled with an oversampling ratio equal to $2^n$, where n is an integer.

22. An imager device, comprising:
an input element arranged to accept radiation and generate an analog input signal;
a plurality of delta-sigma analog-to-digital converters (ADCs) of at least second-order connected to receive and convert said input signal into a digital output signal, each of said plurality of delta-sigma analog-to-digital converters comprising a series of stages, each of said stages connected in a local feedback loop, and each of said stages having a resettable integrator,
wherein each of said resettable integrators is reset for each input.

23. The imager device of claim 22, wherein said plurality of delta-sigma ADCs comprises third-order delta-sigma ADCs.

24. The imager device of claim 22, wherein said input element comprises an array of pixels.

25. The imager device of claim 24, wherein at least one of said delta-sigma ADCs is disposed in each of said pixels.

26. The imager device of claim 22, wherein said plurality of delta-sigma ADCs is disposed in a column buffer connected to receive said input signals from said array of pixels, said delta-sigma ADCs operating in parallel.

27. The imager device of claim 22, wherein at least one of said sigma-delta ADCs is connected to receive a signal from each of said pixels.

28. The imager device of claim 22, further comprising a video amplifier connected to receive a signal from said plurality of delta-sigma ADCs.

29. The image device of claim 22, further comprising an output device connected to display information related to said input signal.

30. The imager device of claim 22, further comprising an output device connected to store information related to said input signal.

31. A method of analog-to-digital conversion, comprising:
providing an analog input signal to a converting stage in a series of converting stages;
integrating said analog input signal at an integrator within said stage to produce an integrated signal;
oversampling said integrated signal such that a plurality of samples are taken, wherein said integrator is reset before each sample is taken;
digitizing said integrated signal;
subtracting said digitized signal from said analog input signal at a summer element to produce a differential signal if a condition is satisfied;
feeding back said differential signal to said integrator within each of said stages; and
resetting said integrator prior to receiving the next input signal.

32. The method of claim 31, wherein said series of converting stages comprises at least three stages.

* * * * *